US007117194B2

(12) United States Patent
Costantino et al.

(10) Patent No.: US 7,117,194 B2
(45) Date of Patent: *Oct. 3, 2006

(54) TEXTUAL AND GRAPHIC DATA PRESENTATION SYSTEM AND METHOD

(75) Inventors: David Costantino, San Diego, CA (US); Richard Donohue, Winthrop Harbor, IL (US)

(73) Assignee: Snap-on Technologies, Inc., Lincolnshire, IL (US)

( * ) Notice: Subject to any disclaimer, the term of this patent is extended or adjusted under 35 U.S.C. 154(b) by 535 days.

This patent is subject to a terminal disclaimer.

(21) Appl. No.: 10/115,322

(22) Filed: Apr. 3, 2002

(65) Prior Publication Data

US 2002/0194153 A1    Dec. 19, 2002

Related U.S. Application Data

(63) Continuation-in-part of application No. 09/951,100, filed on Sep. 12, 2001, now abandoned.

(60) Provisional application No. 60/295,746, filed on Jun. 4, 2001.

(51) Int. Cl.
*G06F 17/30* (2006.01)

(52) U.S. Cl. .................................. 707/1; 707/4; 707/6

(58) Field of Classification Search .............. 707/1–10, 707/100–104.1; 704/2, 8–9, 10; 705/10, 705/14, 27; 715/501.1; 382/232; 709/217
See application file for complete search history.

(56) References Cited

U.S. PATENT DOCUMENTS

| 4,359,222 A | 11/1982 | Smith, III et al. |
| 4,799,188 A | 1/1989 | Yoshimura |
| 4,843,389 A | 6/1989 | Lisle et al. |
| 5,023,610 A | 6/1991 | Rubow et al. |
| 5,133,076 A | 7/1992 | Hawkins et al. |
| 5,229,936 A | 7/1993 | Decker et al. |

(Continued)

FOREIGN PATENT DOCUMENTS

EP    0 369 829    5/1990    ................... 15/403

(Continued)

OTHER PUBLICATIONS

Thexton Manufacturing Company, www.thexton.com, "Designers, Manufacturers, and Suppliers of Innovative and Hard-to-Find Automotive Tools, Testers, and Diagnostic Equipment for the Professional Automotive Technician", downloaded Jun. 12, 2001, 1 page.

(Continued)

*Primary Examiner*—Jeffrey Gaffin
*Assistant Examiner*—Neveen Abel-Jalil
(74) *Attorney, Agent, or Firm*—McDonnell Boehnen Hulbert & Berghoff LLP (57) ABSTRACT

A system and method for use in accessing and displaying information is disclosed. The system and method may include a hand-held device for displaying information; the device may include a processor; a memory; and a word dictionary table stored in the memory. The word dictionary table may include a word list of unique words within the information. The word dictionary table may also include a set of word identification tokens that each represent a word in the list. The memory may also include a phrase dictionary table, which may include a phrase list of word identification token groups, each word identification token group representing a phrase that is contained in the information. The phrase dictionary table may further include a set of phrase identification tokens, each representing one of the phrases in the textual information. The memory may be updated or synchronized via a network that includes a satellite link.

20 Claims, 6 Drawing Sheets

U.S. PATENT DOCUMENTS

| | | | |
|---|---|---|---|
| 5,297,040 A * | 3/1994 | Hu | 704/9 |
| 5,365,434 A | 11/1994 | Figliuzzi | |
| 5,523,943 A | 6/1996 | Maruta et al. | |
| 5,640,552 A | 6/1997 | Yianilos | |
| 5,787,386 A * | 7/1998 | Kaplan et al. | 704/8 |
| 5,895,463 A | 4/1999 | Dowling et al. | |
| 5,951,623 A | 9/1999 | Reynar et al. | |
| 5,974,180 A * | 10/1999 | Schwendeman | 382/232 |
| 6,081,774 A | 6/2000 | de Hita et al. | |
| 6,182,066 B1 * | 1/2001 | Marques | 707/5 |
| 6,236,933 B1 | 5/2001 | Lang | 701/117 |
| 6,295,492 B1 | 9/2001 | Lang et al. | 701/33 |
| 6,332,131 B1 | 12/2001 | Grandcolas et al. | |
| 6,363,373 B1 * | 3/2002 | Steinkraus | 707/3 |
| 6,898,605 B1 * | 5/2005 | Constantino | 707/101 |
| 2002/0019825 A1 | 2/2002 | Smiga et al. | |
| 2002/0063690 A1 | 5/2002 | Chung et al. | |
| 2002/0087408 A1 | 7/2002 | Burnett | |
| 2002/0169743 A1 * | 11/2002 | Arnold et al. | 707/1 |
| 2003/0014295 A1 * | 1/2003 | Brookes et al. | 705/9 |

OTHER PUBLICATIONS

Thexton Manufacturing Company, www.thexton.com/fsdemo/index/html, " Fast-Spec™, Hand-held Informationa System", downloaded Jun. 12, 2001, 1 page.

Thexton Manufacturing Company, www.thexton.com/catalog/is/is_1.htm, "Information Systems", downloaded Jun. 12, 2001, 2 pages.

Thexton Manufacturing Company, www.thexton.com/catalog/is/is_1.htm, "Information Systems", downloaded Jul. 28, 2001, 2 pages.

Data Compression Reference Center, www.rasip.fer.hr/research/compress/algorithms/fund/huffman, "Huffman Coding", downloaded Jun. 20, 2001, 4 pages.

* cited by examiner

| Number of Record | Text | End byte |
|---|---|---|
| 00 01 | EMISSION | 00 |
| 00 02 | CONTROL | 00 |
| 00 03 | DEVICE | 00 |
| 00 04 | APPLICATIONS | 00 |

Fig. 4

| Number of Record | Data Field | End byte |
|---|---|---|
| 00 01 | 00 01 ¦ 00 02 ¦ 00 03 ¦ 00 04 | 00 |
| 00 02 | 00 0D ¦ 00 05 ¦ 00 07 | 00 |
| 00 03 | 00 05 ¦ 00 07 ¦ 00 10 ¦ 00 09 ¦ 00 11 | 00 |

TEXTUAL AND GRAPHIC DATA PRESENTATION SYSTEM AND METHOD

RELATED APPLICATIONS

This application is a Continuation-In-Part of U.S. patent application Ser. No. 09/951,100, filed Sep. 12, 2001 now abandoned titled "Textual Data Storage System and Method," assigned to Snap-on Technologies, Inc.

BACKGROUND

1. Technical Field

A method and system relating to the field of data storage, and, more particularly, a method and apparatus for storing, accessing, and presenting technical information, is disclosed.

2. Description of Related Art

Recent advances in data storage techniques and the development of portable digital assistants (PDAs) and similar devices have made it possible for users to have immediate access to large amounts of data, literally at their fingertips. Such data may include names, phone numbers, addresses, date books, documents, specialized wireless web pages, financial information, personal to-do lists, or calendars.

In addition to providing built-in functions, some PDAs include expansion slots for inserting modules. These modules allow for virtually unlimited functions to be performed by the devices, such as digital photography, MP3 music, memory expansion, games, modems, universal remote controls, or global positioning systems.

Some specialized hand-held devices (i.e., units that are not general-purpose PDAs) have made limited amounts of technical data for use in servicing and repairing automobiles available to users. One such hand-held device provides specifications-dedicated information, such as battery, ignition system, starter, belt tension, engine torque, wheel alignment, and wheel nut torque specifications for a range of vehicles and model years. However, while specialized devices may save a technician a trip to a shop manual for a specification, it is not a replacement for the comprehensive repair information contained in a bound set of shop manuals, such as the manuals published by the Mitchell Repair Information Company (MRIC). Specifically, MRIC illustrates the steps in addition to the raw specifications needed to complete a repair or other operation. Also, specialized handhelds typically don't have any provision for a technician to enter his own information to help him keep track of (or share) what he learns through experience, or to maintain an inventory of his tools, for example.

In addition, updating a similar dedicated device is inconvenient and error-prone: it requires some disassembly of the unit and the removal and replacement, by a user, of an internal memory component that may be sensitive to electrostatic discharge or other damage. Finally, by definition, specialized hand-held references do not provide general-purpose functionality, such as a calculator, date book, or to-do list to help justify their purchase.

General purpose PDAs, on the other hand, do provide a wide range of functions, but due to memory limitations (and limitations of current data compression techniques), they can not store the comprehensive amounts of data needed to make them viable alternatives to hardbound service manuals. Thus, a better solution is desired.

SUMMARY

A method and system for use in accessing and displaying textual and graphic information, such as automotive repair specifications and procedures, is disclosed. The system may (or may not) include a general-purpose PDA as a communication device to display the textual and graphic information to a user. If a general purpose PDA is used, the PDA can, of course, be used for its other included functions when it is not being used as a technician's reference tool. The device may include: a display for displaying information to a user; a processor; a memory; and at least one word dictionary table stored in the memory, the word dictionary table comprising a first list of unique words that are contained in the textual information, and further comprising a set of word identification tokens, each word identification token representing one of the unique words in the first list.

The information in the device's memory may be updated either wirelessly or via a hard-wired interface. Updates may also be made to applications stored in the device's memory, also either wirelessly or via a hard-wired interface. If the device is updated wirelessly, such updates may be made via infrared link, or via RF link, such as IEEE 802.11b, for example. Updated information may be received at a personal computer or a dedicated internet appliance located near the communication device for final transmission to the communication device. The updated information, in turn, may be delivered to the personal computer or internet appliance via the Internet. Once update information is available on the Internet, it can be accessed from virtually anywhere. For example, even very large amounts of data could be transmitted to a user with a very small aperture terminal (VSAT) even where high-speed Internet access is not available or where it would be undesirable to dedicate a telephone line for updates.

The device may also include at least one phrase dictionary table stored in the memory, the phrase dictionary table comprising a second list of word identification token groups. Each word identification token group in turn represents a phrase that is contained in the textual information. The phrase dictionary may further comprise a set of phrase identification tokens, each phrase identification token representing one of the phrases in the textual information.

A user may select various menu items (by, for example, using a touchscreen) to cause the device to display the desired information. In response to the selection of a menu item, the device may display (in uncompressed, human-readable form) a portion of the textual information stored in the memory.

In another embodiment, the memory may comprise one or more user removable memory modules. Through the use of proven, rugged memory modules that may be inserted in an external expansion slot, the data stored in memory can be easily updated. For example, if the device is used to store automotive reference data in accordance with one disclosed embodiment, modules containing specifications for other models of cars can be added. Moreover, modules with data of a type not contained on previously available modules may be supplied to users, greatly expanding the functionality and flexibility of the device. For example, modules could be developed to record and store operating temperatures of various components of a racecar, and the device could then be used to predict failure or improve the performance of the racecar.

By first converting a set of textual information (such as repair information) into word tokens representing unique words in the text and then screening the resulting list of tokens for repeating phrases, very high compression ratios may be realized, especially where certain phrases are repeated in the text frequently. Because of this high compression efficiency, much more data can be stored in a memory of a given size. This compression efficiency, in turn, allows a significant amount of repair information, detailed procedures, specifications, technical service bulletins (TSBs), electrical component locators, to be stored, accessed and displayed from a single, hand-held device. Using such a device, a technician could greatly reduce or even eliminate his reliance on (and the inconvenience of) hardbound shop manuals for repair information. Further, using an efficient compression technique can free up enough memory (either module-based or built-in) to allow a user to store his own notes and tool inventory in the device for quick reference.

BRIEF DESCRIPTION OF THE DRAWINGS

Exemplary embodiments of the present system and method are described herein with reference to the drawings, in which.

DETAILED DESCRIPTION

Figure 1:
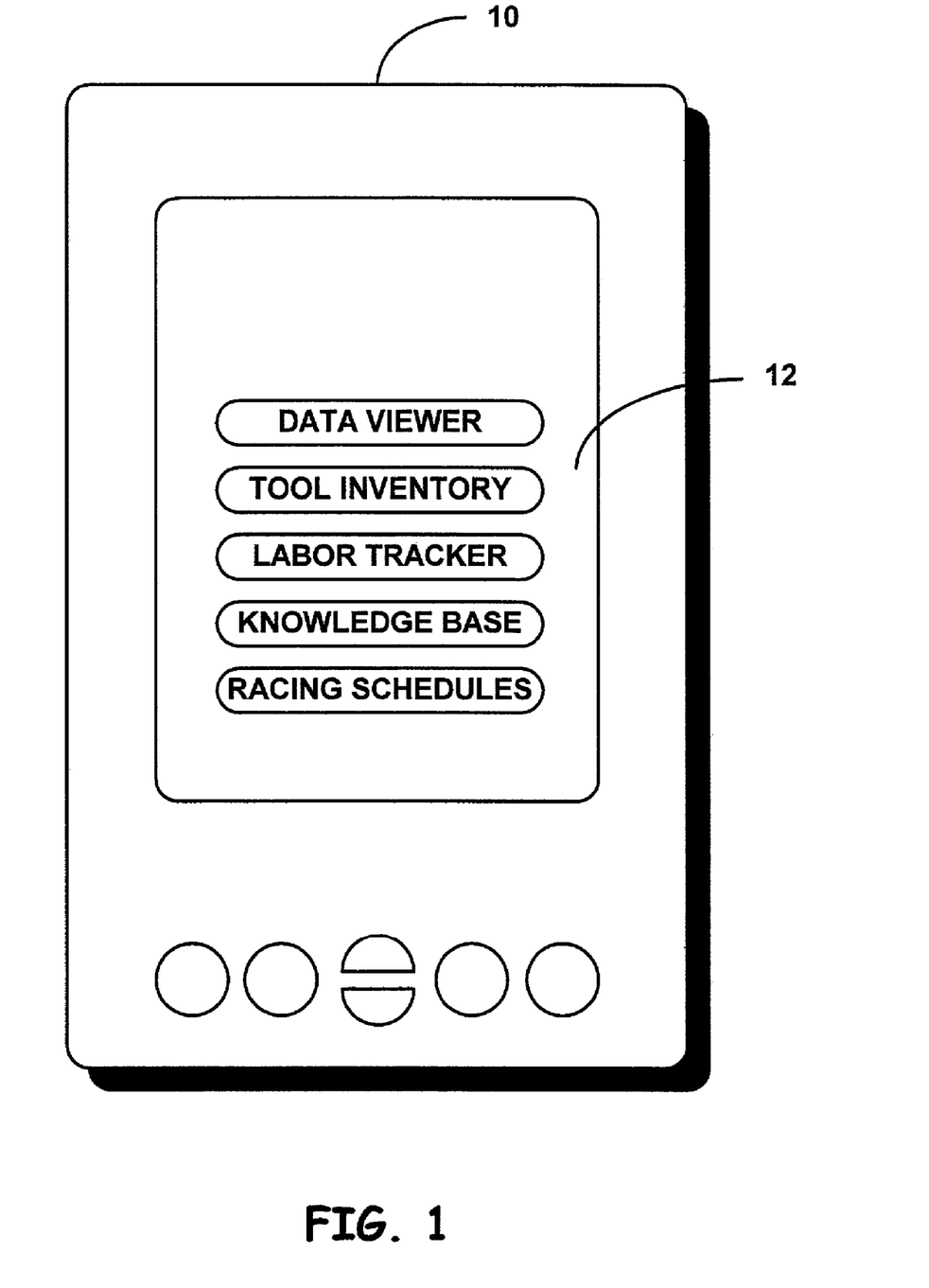
FIG. 1 illustrates a hand-held electronic device with a root-level Smart Data Systems (SDS) menu displayed.
Figure 2:
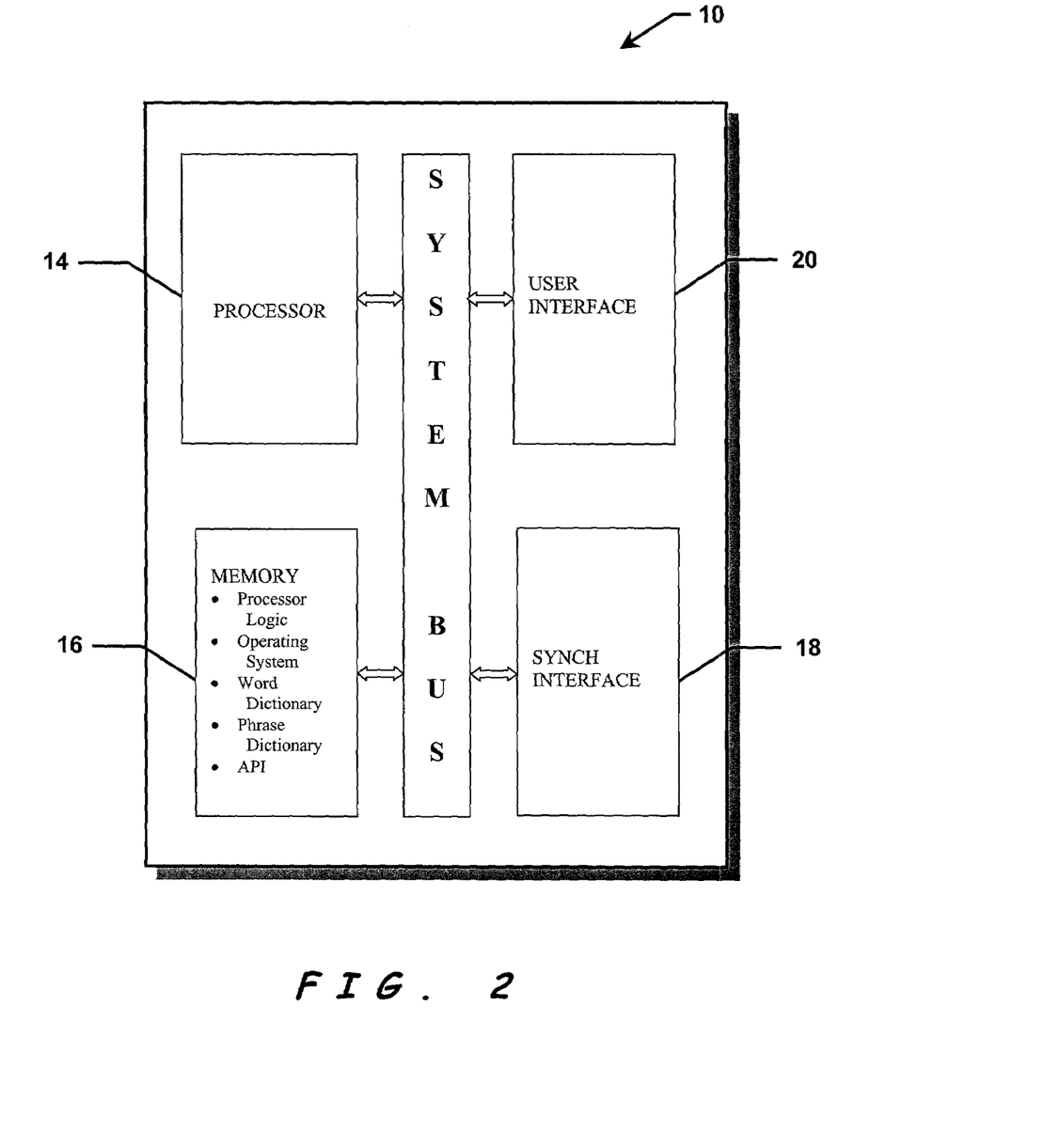
FIG. 2 is a simplified block diagram illustrating a hand-held electronic device in which an exemplary embodiment of an SDS may be implemented.

A hand-held electronic device 10 with a root-level SDS menu 12 displayed is shown in FIG. 1. Hand-held electronic device 10 may be used to store, access, and display textual information. A simplified block diagram of hand-held electronic device 10 is illustrated in FIG. 2. The hand-held device could be a personal digital assistant (PDA) or a similar device. Alternatively, the device could be a stand-alone unit: that is, it could be a device made specifically for displaying information as described herein and not having general purpose functionality. Thus, as used here, the term PDA includes any hand-held electronic device capable of displaying and storing information.

The exemplary embodiment shown in FIG. 2 may have a processor 14 (e.g., an integrated circuit microprocessor), a memory 16 (e.g., memory module, ROM, RAM, flash memory, hard disk), a synchronization (synch) interface 18, and a user interface 20 that may incorporate a display/input, such as a touchscreen, all of which may or may not be interconnected by a system bus. Memory 16 may include more than one physical element, such as built-in ROM, RAM, a removable memory module, and may also include: one or more dictionaries, such as a word dictionary and a phrase dictionary; a set of stored logic by which processor 14 may accept user inputs in order to access information stored in memory 16; a set of stored logic by which processor 14 may display, via user interface 20, information in response to user inputs. Provided with the present disclosure, those skilled in the art can readily prepare appropriate computer instructions to perform such functions.

User interface 20 may include a display such as a liquid crystal display, an active matrix display, or a CRT, and may also include a touchscreen, keypad, or voice input device, for accepting user input.

Synch interface 18 may include one or more inputs and outputs for communicating with various network devices, such as personal computers, dedicated internet appliances, remote access servers, enterprise servers, or the like. Synch interface 18 may be used to configure and update the PDA as necessary. Specifically, synch interface 18 may be used, as one example, to synchronize PDA 10's data with data stored on another device such as a personal computer or a server, to ensure that PDA 10's data is current. Synch interface 18 may include a conductive set of contacts on the PDA, an infrared or other optical interface, or a wireless interface such as the interface defined by IEEE 802.11b. Other wireless radio interfaces are possible as well. Synch interface 18 may also be used to synchronize data between two or more PDAs.

The particular configuration shown in FIG. 2 is not crucial to the functioning of the present embodiment. For example, a device without a system bus that has a memory and processor contained in one integrated circuit could be used instead of a separate processor and memory. Similarly, the use of data modules or built-in memory is not critical to the operation of the SDS. For example, the entire system could operate without memory modules by using any conventional wireless data technology, such as CDMA, TDMA, or GSM, to retrieve the required data from a wireless web server. The system could also operate by accessing data on a computer or an application server using other wired or wireless communication technologies such as, without limitation, RS-232, Ethernet, infrared or RF wireless communications. The data compression technique described could permit much faster data transfer times in systems where all or portions of the text or information to be displayed are stored separately from the handheld (or other) display device.

Data Compression

The exemplary embodiment of the handheld device may include two removable memory modules, which will be referred to as volume I and volume II. The data contained in the volume I and volume II modules require approximately two gigabytes of memory. Because the two modules hold about eight megabytes each, the two gigabytes of data must be compressed to about 16 megabytes to implement the SDS using only two modules. This is a much higher compression than is available with many common data compression methods. For example, "gzip" compression, and some slightly more efficient methods, may produce compression percentages in the range of about 50% to 63%. Compressing 2 gigabytes of data into 16 megabytes, in comparison, represents a compression percentage of 99.2%, although some of this reduction may be due to judicious elimination of unnecessary words and/or phrases.

Figure 3:
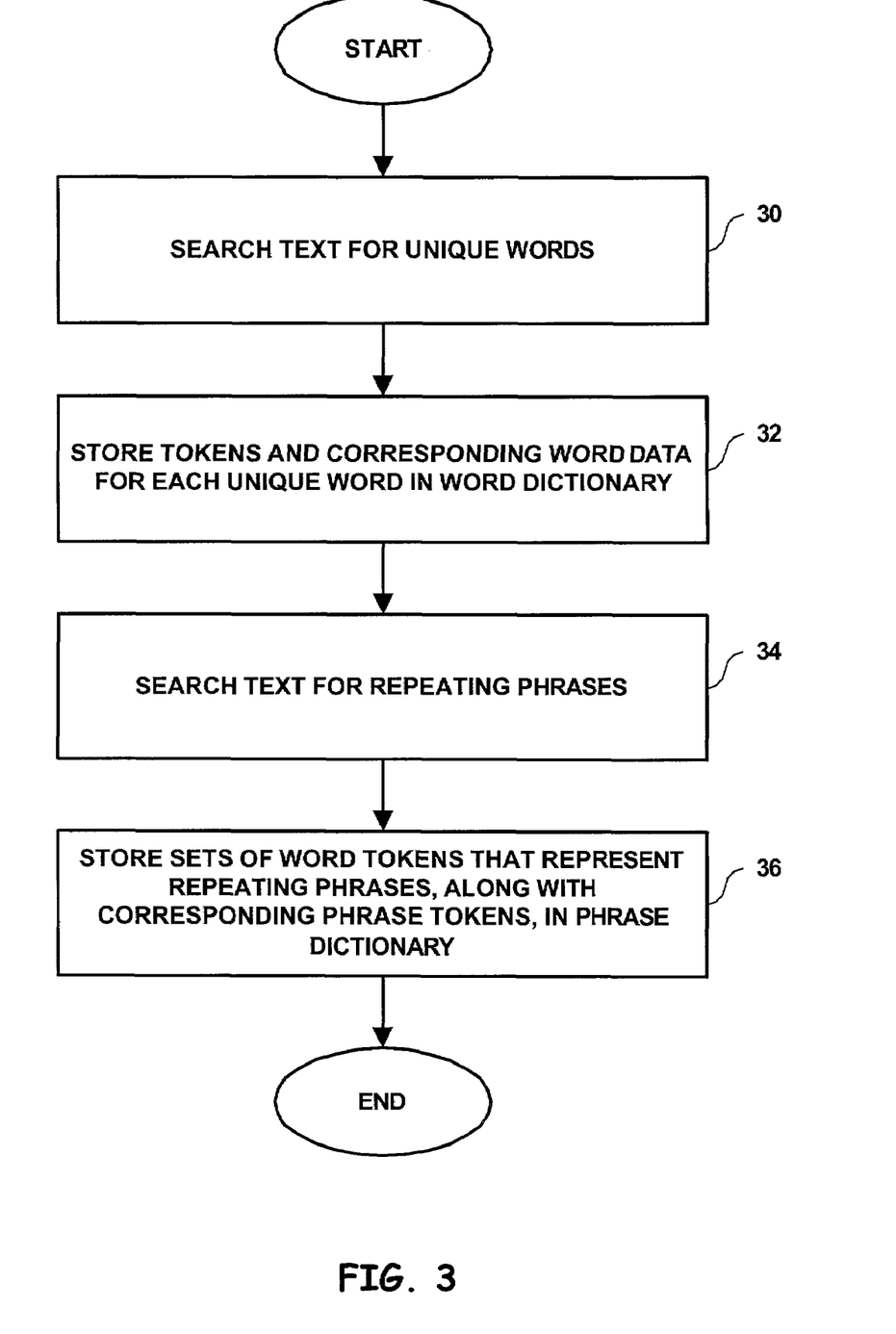
FIG. 3 is a flow chart illustrating the operation of an exemplary embodiment of an SDS.

To achieve this compression, the data may be compressed using two algorithms, both part of a utility program such as the program VBDataConvertSourceCode that is included herein as a CD-ROM appendix. The compression routine described could be implemented using any programming language; the use of any particular programming language is not critical to the proper functioning of the described embodiments. A set of basic steps that may be used to compress data are shown in FIG. 3.

First, a given uncompressed text, known as a "flat file," is searched for unique words—i.e., words that are not already stored in a word dictionary, as shown at step 30. When a unique word is found, the word, along with a two-byte token representing it, is stored in a word dictionary that is part of the handheld device's memory, as shown at step 32. In the present embodiment, the flat files to be compressed are contained in an input database containing eleven tables, ten of which are processed by the data convert utility. These ten tables contain the data for each category used in the SDS. The current categories are: 1) Electrical Component Locators; 2) Engine Performance Technical Service Bulletins; 3) Torque Specifications; 4) Service Intervals; 5) Fluid Capacities; 6) Brake Specifications 7) Brake Bleeding 8) Service Reminder Indicator Reset Procedures 9) Emission Control Application Tables; and 10) Tune-Up Specifications.

Thus, textual information for each category may be stored as a number of 2-byte word identification tokens that can represent words of any length; the words can be displayed in uncompressed or "readable" form when a user accesses the text by "drilling down" through the menus displayed on the PDA. Word identification tokens and the words they represent can be stored in memory 16 as fields of the same record in the word dictionary. For example, the word identification token or "word ID" could be stored in a field called an IDX (i.e., an "index") field, while the actual word may be stored in a corresponding field of the same record, called a DATA field, as shown below.

| FIELD NAME | FIELD TYPE |
| --- | --- |
| IDX | Long Integer |
| DATA | Text |

Figure 4:
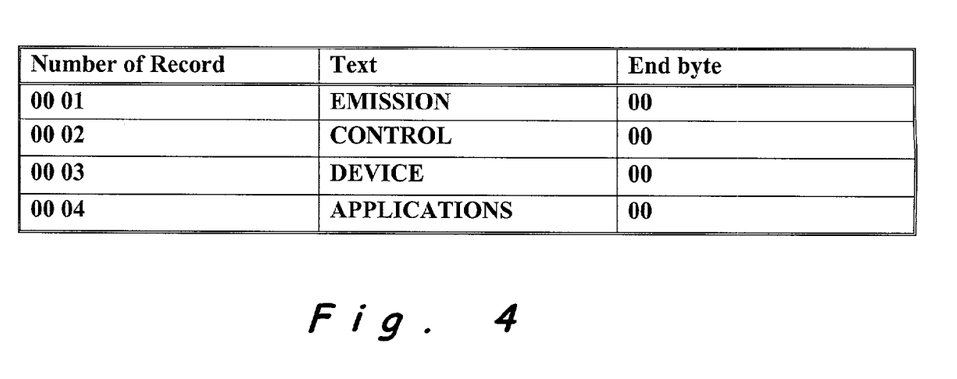
FIG. 4 is a table illustrating an exemplary embodiment of a word dictionary.

An exemplary portion of a word dictionary is shown at FIG. 4. Each record begins with the number of the record, and ends with the byte 00. Between the record number and the end byte is a variable length field containing the word.

Further compression of a word dictionary can be accomplished by eliminating the use of a separate word stored as a capitalized word. Instead, all words in the dictionary may be stored uncapitalized and the words may be capitalized if necessary at the time they are displayed by using rules to determine if the words would ordinarily be capitalized. For example, a word that is immediately preceded by a period and a space may be capitalized.

When a group of words appears frequently (or, at a minimum, more than once) in a given text, those groups may be termed "phrases", and each phrase may be tokenized. Different sized portions of a text can be searched for phrases to increase compression efficiency, as described in more detail below. To accomplish phrase tokenization, first the word tokenized data may be searched for repeating phrases, as shown at step 34. It would also be possible, however, to search a flat file for repeating phrases to be compressed. The order of compression is not critical to the exemplary embodiment. Any repeating phrases may be stored in a table called a phrase dictionary. The phrase dictionary, also contained in memory 16, could thus contain a word identification token group that represents the phrase, and a given group of word tokens can be represented by a phrase identification token in the table. In a fashion similar to the method of creating the word dictionary, the phrase identification token or "phrase ID" could be stored in a field called an IDX field. The actual set of word identification tokens or word IDs that represent the phrase may be stored in a corresponding field of the same record, called a DATA field, as shown below and as represented by step 36.

| FIELD NAME | FIELD TYPE |
| --- | --- |
| IDX | Long Integer |
| DATA | Set of Word Tokens |

As was the case for the word dictionary, the textual information represented by a phrase may be represented by a two-byte token; the entire phrase represented by the token may be displayed in uncompressed form whenever the two-byte token is encountered in a compressed text (i.e., a particular list of phrase and word tokens that represent textual information). In a given compressed text, a byte "FF" could signify that the following byte is the number of a phrase record, to distinguish the byte from a word token.

Figure 5:
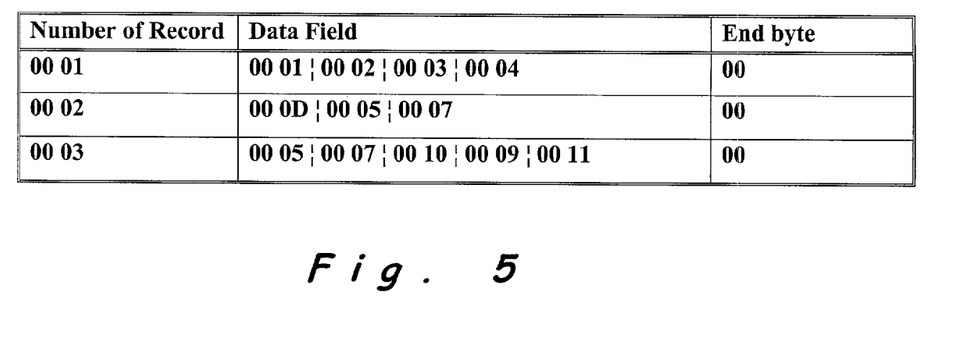
FIG. 5 is a table illustrating an exemplary embodiment of a phrase dictionary.

An exemplary portion of a phrase dictionary is shown at FIG. 5. Each record begins with the number of the record, and ends with the byte 00. Between the record number and the end byte is a variable length field containing the word record numbers (tokens) that represent the phrase. In the example of FIG. 5, record number one (00 01) represents the phrase "Emission Control Device Applications", comprised of the words stored in the word dictionary of FIG. 4. In compressed form, this phrase could be represented by "FF 00 01". Record number two represents a 3-word phrase, and record number three represents a 5-word phrase.

The efficiency of the two-pass compression technique can be affected (e.g., improved) by adjusting the length of the phrases that are to be compressed. For example, searching a set of word tokens only for phrases consisting of two words, and storing those two words as a phrase, might not be very efficient, since the storage overhead, or amount of memory used just to store the phrases and their indexes, would greatly reduce any compression efficiency that might be gained from the second compression pass.

Similarly, searching for and storing only phrases that are so long that not many phrases are actually found and stored might provide little, if any, gain in compression over the first pass. Further, if the phrase dictionary is too long, which might result from including too broad a range or phrase lengths (e.g., 2 to 20 words in a phrase), the access time required to display the text could increase to the point of diminishing returns. Specifically, accessing stored text might take so long that users are unsatisfied with the end product.

Figure 6:
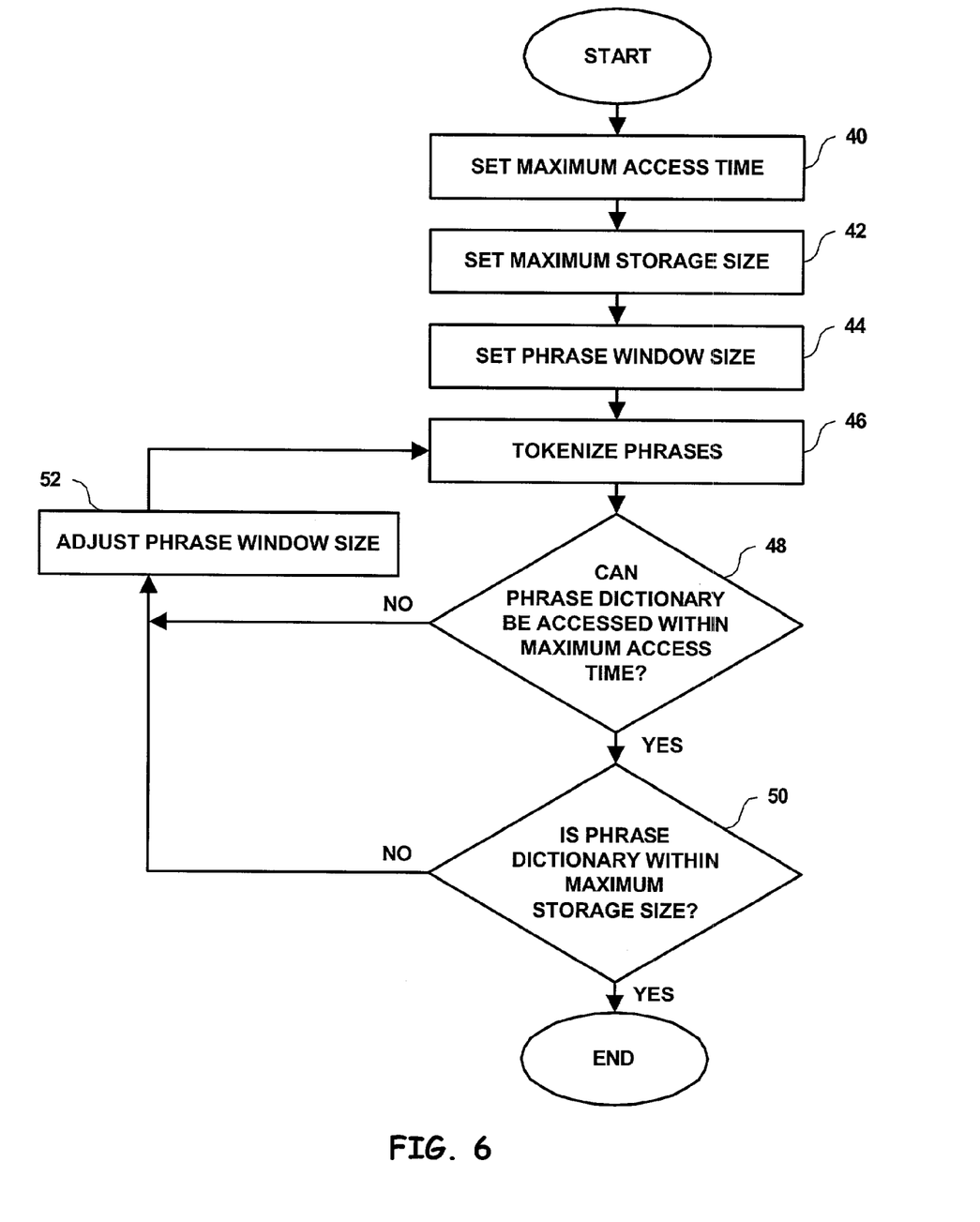
FIG. 6 is a flow chart further illustrating the operation of an exemplary embodiment of an SDS.

FIG. 6 illustrates a set of functions that may be involved in either optimizing the phrase length or bringing it within acceptable limits. The maximum desirable access time for a phrase dictionary of any given length may be set, as shown at step 40. Also, the maximum acceptable storage size for phrases (e.g., the available storage size) may be set, as illustrated at step 42. Next, a phrase window size may be set, as shown at step 44. Setting the initial phrase window size to be used need not be random. For example, if a phrase length between 4 and 12 words has been determined to be optimum for a given text, that phrase window size could be used as a starting point in an unknown text. It should be realized, however, that a different phrase window size could be optimal for any particular text.

Next, the phrases can be tokenized and stored in a phrase dictionary, shown at step 46 (and described in greater detail with reference to FIG. 3). When that step is done, it may be determined whether the phrase dictionary can be accessed within the maximum access time, shown at step 48, and whether the phrase dictionary can be stored in the available or acceptable space, step 50. If it is determined at step 48 or step 50 that the phrase window size is not optimum or at least acceptable, the phrase window size may be adjusted as shown at step 52 and part of the process (i.e., steps 46–52) may be repeated as often as required. The minimum phrase length, the maximum phrase length, or both, may be adjusted at step 52. It is not necessary that the absolute optimum phrase window size be determined for any given text. Specifically, once it is determined that a compressed text will fit within an available memory size and can be accessed within an acceptable time, the "optimization" procedure may be stopped.

As part of the data conversion utility, the size of any particular article to be displayed can be calculated. Once the size is calculated, an access time flag can be set if necessary (for example, in the case of large articles) so that the PDA can display a message such as "Please wait . . . this may take up to 60 seconds"; this can prevent user frustration while users are waiting for an article to be displayed.

The compression technique described can be performed "offline"; that is, once it is complete, the compressed text created and stored in memory can be accessed and displayed without any further use of (or delay associated with) the compression utility.

An exemplary SDS could be implemented using one or more data modules (volumes) that contain automotive data. A technician in an automotive repair shop may use a PDA equipped with an SDS data module to quickly reference selected specification-type information from a comprehensive automotive repair database. Alternatively, a stand-alone hand-held device (i.e., a device that does not provide the general purpose functionality of a PDA) may be used to provide specification-type reference information to a technician. Such a stand-alone device may or may not have removable data modules.

For simplicity and ease of operation, an SDS application used in conjunction with a general purpose PDA may launch automatically when a module is inserted into the PDA; once SDS is launched, a user need only select a menu item that corresponds to the information the user needs in order to proceed. Of course, the user may also launch the SDS application at any time by selecting its icon from the PDA's "home" screen.

Although an embodiment using two memory modules has been described, the number of modules required to implement SDS is not critical, and with advances in data storage devices and compression, it is possible that all required data could be stored on a single module; it is also possible that the data could be stored in a PDA's internal (i.e., non-removable) memory.

In the exemplary embodiment, the five selectable menu items (each of which is a separate application) may include:
A Data Viewer menu;
A Tool Inventory menu;
A Labor Tracker menu;
A KnowledgeBase menu; and
A Racing Schedules menu.

Any menu item may be accessed by the well-known use of a PDA touchscreen. Alternatively, any menu item may also be accessed by using a keypad or keyboard to scroll through menu items or to directly enter a letter or word that will allow access to the menu item that is desired. In such an alternative embodiment, the display may or may not be a touchscreen display. Regardless of the physical implementation, any such menu access devices may be referred to generally as "keypads", while the term "touchscreen" includes a liquid crystal display, a flat-panel display, a CRT, or other display for providing visual information to a user.

As an illustration of accessing data, a user could access the "Data Viewer" menu item shown in FIG. 1 by touching the Data Viewer "key" or display area with a stylus. Once activated, the Data Viewer application (which is a PalmOS based application, but could be any other suitable application) displays further information, referred to as quick reference data, regarding particular vehicles. Upon entering the vehicle year, make and model, (entered, again, via touchscreen or its equivalent), users can choose to see information, contained in data sets, that is most frequently needed during the course of repairing a particular vehicle. A first data set containing the information provided by the Data Viewer for each particular year, make, and model of vehicle (and contained, for example, in the volume I module) may include:
Brake Bleeding Procedures;
Brake Specifications;
Emission Control (EC) Applications;
Fluid Capacities;
Service Intervals;
SRI (Maintenance light) Reset Procedures;
Torque Specifications; and
Tune-Up Specifications;
A second data set, which may be contained in the volume II module, may include:
Electrical Component Locators; and
Engine performance Technical Service Bulletins.

Other data sets, such as air conditioning specifications, could also be easily added to an existing data module or to an additional module. Implementing the SDS using modules (rather than, for example, a dedicated device) makes it easy for the data sets to be expanded and/or updated, and, further, a technician can enter his own data into the modules, as will be described below.

In the exemplary embodiment, accessing the SDS data may be done by first selecting the "Data Viewer" application and then selecting a year, make and model for the desired vehicle using drop-down menus as described above. After a year, make, and model of vehicle is selected, a category of data may be entered, depending on the data module (i.e., volume I or volume II) that is installed in the PDA and the information desired. Once a category of data, such as "Engine Performance TSBs", is chosen, users can select an appropriate TSB. The desired information may then be displayed on the PDA. For example, a user could select and access TSBs for a 1995 Chevrolet Camaro (not shown). At the next level, the TSB text that would result if a user then selected the "Low voltage reading or dim lights . . . " menu item could be displayed (not shown). The Data Viewer application thus allows a user to quickly and easily find information for a particular automobile by simply walking over to his toolbox, rather than across a shop floor, and entering the year, make, model, and information that he is looking for.

In addition to the Data Viewer software application, the SDS also may include four (or more) applications, each having its own source code.

A "Labor Tracker" is one such possible application; it is designed for a technician or user to keep track of the hours worked, organized by repair order. It also gives users the ability to input their own hourly rate, so that at any time, they can calculate what their weekly pay will be based on the repair orders they've entered to date. The system could display, for example, that a user has worked 1.7 hours on repair order 123456, 4.4 hours on repair order 174365. The information could be displayed in table format, so a technician could see at a glance which repair orders were worked on, and for how long, for any given time period (the time periods may be defined during set up of the Labor Tracker application).

If the user set up an hourly rate of, for example, $25, and worked the above hours during the week ending Sep. 9, 2001, the user could select the "calculate" key of the PDA and it could display "week ending Sep. 9, 2001" and the amount $152.50 earned so far for that week. The Labor Tracker application also allows a technician to review the money earned for past periods.

Another possible application is the "Tool Inventory" application. The Tool Inventory gives a technician the ability to keep track of all the tools in his toolbox, in the palm of his hand. This can be done by using one of two methods in the SDS Tool Inventory application program. The first method is the "tool builder", which allows drop down "menu picks" of what type of tool is being entered, how large it is, what type of voltage (where applicable), what color it is, and so forth. When a drop-down menu item is selected, the item may then be entered into the handheld device, along with the quantity. Alternatively, a technician can use manual entry via either the on-screen keyboard or the Graffiti®-method, to enter a tool description.

Another exemplary application is called KnowledgeBase™. The KnowledgeBase™ is a technician's personal database. The KnowledgeBase™ enables technicians to categorize by year, make and model, any kind of information they want to keep track of for that vehicle—whether it is a unique repair operation, a mileage interval for planning or scheduling maintenance, a record of the owner, and so on. The technician can keep his own personal database right in his PDA's data module. The data stored in modules for the Labor Tracker, Tool Inventory, and KnowledgeBase applications can be retained in the modules even when the PDA is powered off; moreover, by inserting modules into any PDA, the stored data can be accessed.

Yet another exemplary application is the "Racing Schedules" application for the five popular racing series: NASCAR (North American Stock Car Auto Racing), CART (Champion Automotive Racing Teams), NHRA (National Hot Rod Association), IRL (Indy racing league) and SCORE (Southern California Off Road Events).

Thus, in the exemplary embodiment, SDS may comprise six applications; the five that users can select and also the launcher itself, which allows a user to choose which application to use. Each application could include its own source code. Further, the system's flexibility would easily allow for the additions of further applications, should a need or desire for them arise.

For example, repair estimates that are now done using bound manuals may be performed by a PDA using the SDS. Thus, an estimator could select a year, make, and model and a particular repair operation, and the SDS could cause the PDA to display the parts, labor, and time for the operation according to known repair data. Such an estimate could be completed in much less time than would be required using a bound volume to look up the information. As another alternative application, one module might be used for imported cars and another module for domestic.

SDS could also be used to assist a technician in training for ASE exams. ASE (the National Institute for Automotive Service Excellence) is a certifying body for automotive technicians, and ASE has 11 exams that a technician must pass in order to be certified as a master technician. An SDS module may thus include practice examinations; a user could have a PDA display a question and an answer, and track the user's practice score for him, display the results, and indicate where the user needs to improve.

Another possible use for SDS is as a diagnostic tool. For example, a non-contact infrared thermometer sensor's electronics may be used in conjunction with a removable data module. Without touching a surface, an infrared thermometer can read a heat signature. Once the temperature of a part of an automobile is taken, it can be integrated into an SDS database for any particular vehicle or type of vehicle. The temperature data, once in the SDS database, could easily be recalled. Such an application might be used in the racing industry for example, where crewmembers are constantly taking tire temperatures, brake temperatures. SDS may then be used as a diagnostic or preventative tool, as one example, to avoid brake fade if it is determined that one brake is heating up more than another (or is heating up outside of its expected range).

Other uses for temperature data might include reading the temperature of different cylinders, the exhaust manifold, radiator temperature, air conditioning condenser temperature, rear window defroster temperature, bearing temperatures (such as alternator bearings, or the bearings of virtually any rotating part). Further, a user might measure the catalytic converter temperature to determine if the engine is running normally.

Thus, actual temperature data may be compared to predicted normal temperature data, such as data provided by MRIC to make improved diagnostic decisions. An SDS module (or set of modules) could be provided that contains an extensive database for normal temperatures for virtually any make, model, and year of vehicle. The temperature database could be accessed in the same way as brake bleeding specifications, as described above. Other types of diagnostic tools could also be used with the SDS system.

Figure 7:
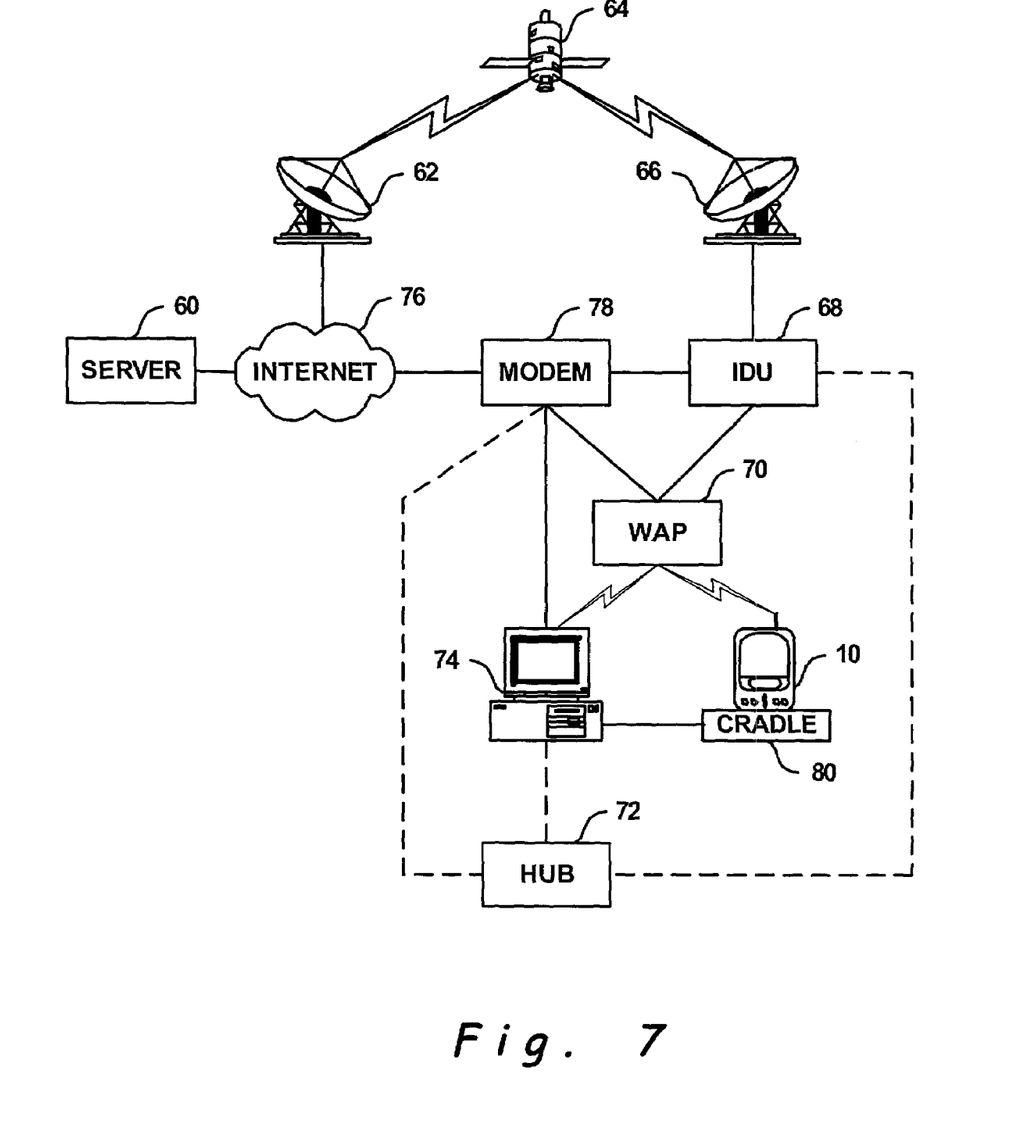
FIG. 7 is a simplified diagram of a network in which an exemplary embodiment of an SDS may be implemented.

Further, using a network as shown in FIG. 7, a PDA could be continually or substantially continually synchronized with or updated from a much larger database via a network. For example, a comprehensive, frequently updated technical database could be maintained on a server 60 in communication with the Internet. Any information in this database could be transferred to a PDA or other communication device via a satellite connection or, alternatively, via a terrestrial communications link. Further, applications used by the PDA to access technical information could also be updated via the network of FIG. 7.

The use of a satellite connection could provide connectivity virtually anywhere, which could be especially important to users who require a high-speed connection and who don't have access to a terrestrial high-speed internet connection. The satellite connection may include a VSAT master earth station 62, a satellite 64, and a VSAT earth station. The VSAT earth station could include a VSAT dish antenna 66, a low-noise amplifier (not shown), and an indoor unit (IDU) 68. IDU 68 may be communicatively coupled to a wireless access point, such as WAP 70, or, alternatively, to a, hard-wired LAN device, such as Ethernet hub 72 or any other suitable network device, such as a USB hub, for example. If IDU 68 is connected to WAP 70, WAP 70 may transmit data received from a server 60 to PDA 10 and/or personal computer 74. PDA 10 and PC 74 could be equipped with a wireless network interface card (NIC) to receive the data. The data transmitted to PDA 10 or PC 74 could be compressed as described above. If the data is compressed, it may be stored in PDA 10's memory for access either immediately or even when PDA 10 is offline—i.e., not in communication with a server 60. Alternatively, PDA 10 could be used as a real-time display device to allow viewing of content from a server 60 online, much as a user might access a web page from a personal computer's browser. WAP 70 could also transmit data directly to PDA 10 equipped with a wireless NIC, or to any other device so equipped.

It is not necessarily critical to all embodiments to transmit data to PDA 10 wirelessly or via satellite to update PDA 10. For example, PDA 10 could be updated via Internet connection 76. Internet connection 76 could be any suitable connection, such as a public-switched telephone network connection, DSL connection, or cable internet connection, and these connections could be provided to modem 78. Modem 78 could then provide data to WAP 70, in which case updating or synchronization could proceed as described above. Alternatively, modem 78 could provide data via a hardwired or wireless connection to PC 74, which could then update PDA 10 via synchronization cradle 80.

Regardless of the type of communication connection used, synchronization or updating of PDA 10 or other devices can be accomplished readily and at high frequency, if not continually, using the network of FIG. 7. Such update frequency could be especially helpful, for example, to keep users apprised of recently released TSBs, as well as any other technical information that might be updated more frequently than CDs, hardcopy manuals, or other media are updated. Typically, TSBs on compact disc (CD) or on hardcopy volumes are only updated quarterly, even though about 40 TSBs a week are generated by automobile manufacturers. Thus, continuous updates could provide an advantage to users of a connected PDA or other device as shown in FIG. 7.

As another example, if a technician is working on the brakes for a car that is relatively rare and requires information not contained in a particular SDS module, the technician could retrieve the brake information from a larger database, such as a database maintained on a server 60.

Although several possible embodiments of an apparatus, system, and method have been described, various changes and modifications may be made or suggested by those skilled in the art without departing from the spirit or scope of the claims that follow.

We claim:

1. A method for storing in memory data in compressed form, wherein the data includes a series of words, each word having a size, the method comprising:
   associating a word token to each unique word of the data, each word token having a size, wherein the size of each word token is independent of the size of the unique word;
   storing in the memory a word dictionary, wherein the word dictionary comprises each unique word and its associated word token;
   converting each of the series of words in the data into a series of word tokens so as to produce tokenized data, wherein each of the series of word tokens corresponds to one of the word tokens in the word dictionary;
   associating a phrase token to each repeated phrase in the tokenized data, wherein each of the repeated phrases comprises a sequence of the word tokens in the tokenized data;
   storing in the memory a phrase dictionary, wherein the phrase dictionary comprises each repeated phrase and its associated phrase token;
   converting each repeated phrase of the tokenized data into its associated phrase token;
   storing in memory the tokenized data, whereby the tokenized data has a size less than the size of the series of words when at least one of the words is sized larger than its associated word token, and when the tokenized data comprises at least one repeated phrase; and
   updating the data via a synchronization interface.

2. The method of claim 1, further comprising:
   determining a compression-efficient-phrase length for repeated phrases in the tokenized data, wherein the compression-efficient-phrase length allows for efficient compression of the tokenized data, and wherein each of the repeated phrases comprises a sequence of the word tokens in the tokenized data.

3. The method of claim 1, wherein the data comprises textual information.

4. The method of claim 3, wherein the textual information comprises automotive repair and servicing information.

5. The method of claim 1, wherein the memory comprises at least one removable module.

6. The method of claim 1, wherein updating the data includes receiving, at the synchronization interface, data from a communications network.

7. The method of claim 6, wherein the synchronization interface comprises a wireless interface.

8. The method of claim 6, wherein the synchronization interface comprises a set of electrical contacts communicatively connectable to a synchronization cradle communicatively coupled to a network device.

9. The method of claim 7, wherein the wireless interface is an infrared interface.

10. The method of claim 7, wherein the wireless interface is a radio frequency interface.

11. The method of claim 6, wherein the communications network comprises a satellite network.

12. The method of claim 6, wherein the communications network comprises the Internet.

13. A method for storing in memory data in compressed form, wherein the data includes a series of words, and wherein each word of the series of words has a size, the method comprising:
   (a) associating a word token to each unique word in the data, wherein each word token has a size, the size of each word token being independent of the size of the unique word;
   (b) storing in the memory a word dictionary, wherein the word dictionary comprises each unique word and its associated word token;
   (c) converting each of the series of words in the data into a series of word tokens so as to produce tokenized data, wherein each of the series of word tokens corresponds to one of the word tokens in the word dictionary;
   (d) determining a compression-efficient-phrase length for repeated phrases in the tokenized data, wherein the compression-efficient-phrase length allows for efficient compression of the tokenized data, and wherein each of the repeated phrases comprises a sequence of the word tokens in the tokenized data;
   (e) associating a phrase token to each repeated phrase having the compression-coefficient-phase length;
   (f) storing in the memory a phrase dictionary, wherein the phrase dictionary comprises each repeated phrase having the compression-efficient-phrase length and the phrase token associated with each repeated phrase having the compression-efficient-phrase length;

(g) converting each repeated phrase of the tokenized data having the compression-efficient-phrase length into its associated phrase token;

(h) storing in memory the tokenized data, whereby the tokenized data has a size less than the size of the series of words when at least one of the words is sized larger than its associated word token, and when the tokenized data comprises at least one repeated phrase; and (i) updating the word dictionary, phrase dictionary, and tokenized data via a synchronization interface.

14. The method of claim 13, wherein the memory comprises a removable memory and the data comprises textual information.

15. The method of claim 14, wherein the textual information comprises a plurality of words is formatted in accordance with the American Standard Code for Information Interchange (ASCII), wherein each character of the ASCII formatted words is one (1) byte, wherein each word token comprises two (2) bytes, and wherein when any word is greater than three characters, then the tokenized data uses less storage space than the series of words.

16. The method of claim 13, further comprising searching the data for unique words, wherein when a unique word is found, carrying out the steps of associating the word token to the unique word, and storing in the word dictionary the unique word and the associated word token.

17. The method of claim 13, further comprising searching the tokenized data for the repeated phrases, wherein when a repeated phrase is found in the tokenized data, carrying out the steps of associating the phrase token to the repeated phrase, and storing in the phrase dictionary the repeated phrase and the associated word tokens.

18. The method of claim 13, wherein the memory has a given capacity, wherein the data is larger than the given capacity, and wherein after carrying out steps (a)–(i) the tokenized data, the word dictionary, and the phrase dictionary fit within the given capacity.

19. The method of claim 13, further comprising:

(j) obtaining, via a synchronization interface, new data that is in uncompressed form, wherein the new data includes a series of words;

(k) associating a word token to each unique word in the new data, wherein at least one word token is arranged so as to use less storage space than its associated unique word; and performing elements (b)–(i).

20. The method of claim 19, wherein obtaining, via a synchronization interface, the new data comprises obtaining the new data via a wireless synchronization interface.

* * * * *